United States Patent
Park et al.

(10) Patent No.: US 7,577,001 B2
(45) Date of Patent: Aug. 18, 2009

(54) SUPPORT STRUCTURE OF ELECTRONIC DEVICE AND HARD DISK DRIVE COMPRISING THE SAME

(75) Inventors: Kwang-Hoon Park, Suwon-si (KR); Jong-Yun Yun, Suwon-si (KR); Joo-Won Cho, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 254 days.

(21) Appl. No.: 11/648,563

(22) Filed: Jan. 3, 2007

(65) Prior Publication Data

US 2007/0165385 A1    Jul. 19, 2007

(30) Foreign Application Priority Data

Jan. 16, 2006    (KR) ...................... 10-2006-0004574

(51) Int. Cl.
*H05K 7/02* (2006.01)
(52) U.S. Cl. ...................................... 361/807; 174/250
(58) Field of Classification Search ................ 174/250, 174/72 A; 361/685, 807
See application file for complete search history.

(56) References Cited

U.S. PATENT DOCUMENTS

| | | | |
|---|---|---|---|
| 6,324,054 B1 * | 11/2001 | Chee et al. | 361/685 |
| 6,750,404 B1 * | 6/2004 | Anslow et al. | 174/262 |
| 6,958,884 B1 * | 10/2005 | Ojeda et al. | 360/97.02 |
| 7,136,248 B2 * | 11/2006 | Tanner | 360/73.03 |
| 2002/0135933 A1 * | 9/2002 | Harrison et al. | 360/97.02 |

FOREIGN PATENT DOCUMENTS

| | | |
|---|---|---|
| JP | 00205166 A | 8/1997 |
| JP | 2002-231865 | 8/2002 |
| JP | 2004-072106 | 3/2004 |
| KR | 90-7288 | 9/1990 |
| KR | 100155944 B1 | 7/1998 |

* cited by examiner

*Primary Examiner*—Dean A. Reichard
*Assistant Examiner*—Yuriy Semenenko
(74) *Attorney, Agent, or Firm*—Volentine & Whitt, PLLC

(57) ABSTRACT

A hard disk drive (HDD) includes a disk, a spindle motor assembly for rotating the disk, an arm assembly for reading data from and/or reproducing data onto the disk, integrated circuits (ICs) for controlling the spindle motor and arm assemblies, a printed circuit board (PCB) having integrated circuit (IC) mounting areas on which the ICs are mounted and a through-hole open to at least one of the IC mounting areas and a base to which the spindle motor assembly, arm assembly and PCB are assembled, the base including a heat dissipation column contacting the PCB opposite the IC mounting area so as to transfer heat generated by the IC to the base. The heat dissipation column includes a heat dissipation body and at least one hemispherical protrusion protruding from a surface of the body into the through-hole and into contact with the PCB. The base has a simple structure that is easy to manufacture, and the heat dissipation column of the base does not affect the overall size of the HDD and can effectively dissipate the heat generated by the IC during the operation of the HDD.

19 Claims, 6 Drawing Sheets

SUPPORT STRUCTURE OF ELECTRONIC DEVICE AND HARD DISK DRIVE COMPRISING THE SAME

BACKGROUND OF THE INVENTION

1. Field of the Invention

The present invention relates to support structure of an electronic device, such as a hard disk drive, which includes a printed circuit board (PCB) and facilitates the dissipation of heat from an integrated circuit (IC) mounted to the PCB. More particularly, the present invention relates to a hard disk drive which facilitates the dissipation of heat from a hard disk controller (HDC) or a combo IC mounted to the PCB of the drive.

2. Description of Related Art

Hard disk drives (HDDs) are memory devices that can record and reproduce a large amount of data at high speeds. Accordingly, hard disk drives are widely used as auxiliary memory devices for computer systems. A HDD generally includes a printed circuit board, ICs in the form of chips mounted to the printed circuit board, a platter having a magnetic layer on which data is recorded, and various mechanical parts that are used to rotate the platter and record and/or reproduce data onto or from the platter. In operation, electric power supplied to the PCB operates the mechanical parts under the control of one or more of the ICs such as an HDC (hard disk controller) or a combo IC. Accordingly, the IC generates heat. The heat generated in the HDD must be dissipated to prevent the HDD from malfunctioning, to prolong the useful life of the various parts of the HDD, and to prevent data recorded on the magnetic layer of a platter from being lost.

FIG. 1 shows a base 160, a printed circuit board 110, and ICs 122 of a conventional HDD. In the conventional HDD, the base 160 and printed circuit board 110 are coupled to each other by screws 121. Also, the ICs 122 are installed on a surface of the PCB 110. Particular ones of the ICs 122 such as an HDC 126, a combo IC (not shown), and a memory chip 128 conduct a great amount of current and thus, generate a great deal of heat.

More specifically, the PCB 110 has a via hole 111, and a conductive pad connected to an inner circumferential wall 111a that forms the via hole 111. The inner circumferential wall 111a is formed by copper plating the substrate of the PCB in a through-hole of the substrate. A ground 122a coupled to the lower surface of the IC 122, such as the HDC 126, is connected to the conductive pad 111b by solder 119 at the upper surface of the PCB 110. The via hole 111 is located in an area of the PCB 110 above which the IC 122 is disposed. The heat generated by the IC 122 is dissipated by conduction via the ground 122a, solder 119, the conductive pad 111b, and inner circumferential wall 111a, and by convection at the inner circumferential wall 111a, as indicated by the arrows in the enlarged portion of FIG. 1.

However, in the conventional HDD, the heat generated by the IC 122 is also transferred along the PCB 110 in the directions indicated by the arrows on the PCB 110. The heat is transferred to the base 160 via the screws 121 and bosses 163 of the base 160 to which the screws 121 are threaded. The base 160 is formed of aluminum. The heat spreads over the entire surface of the PCB 110 as the heat is transferred to the base 160. Thus, the heat passes through surrounding devices 125 mounted to the PCB 110. The heat negatively affects the surrounding devices 125 or adds to the heat radiating from the respective ICs 122. As a result, the overall average temperature of the PCB 110 becomes excessive.

Additional heat dissipating structures have been considered to solve the above-described problem. However, such structures tend to be complex and therefore difficult to manufacture, the manufacturing of an additional heat dissipating structure adds to the cost of the HDD, and the addition of another heat dissipating structure could undesirably increase the bulk of the HDD.

SUMMARY OF THE INVENTION

An object of the present invention is to provide support structure of an electronic device which includes a PCB and efficiently transfers heat from at least one IC mounted to the PCB.

Another object of the present invention is to provide a hard disk drive (HDD) having a base that is easy to manufacture and includes means to transfer heat from an IC mounted to the PCB of the HDD, wherein the means does not affect the overall size of the HDD.

Another object of the present invention is to provide an HDD whose IC/ICs and devices near the IC/ICs have useful lives that are longer than those of similar components of the HDD according to the prior art.

Likewise, another object of the present invention is to provide an HDD that is less likely to malfunction or fail than the HDD according to the prior art.

According to an aspect of the present invention, there is provided support structure of a hard disk drive or the like, comprising an integrated circuit (IC), a printed circuit board (PCB) to which the IC is mounted and having a through-hole open at an integrated circuit (IC) mounting area over which the IC extends, and a base supporting the printed circuit board, wherein the base includes a heat dissipation column contacting the PCB at a location directly opposite the IC mounting area so as to transfer heat generated by the integrated circuit to the base. The heat dissipation column may contact the PCB along an inner circumferential wall of the PCB that defines the though-hole in the substrate of the PCB. Preferably, the heat dissipation column comprises a heat dissipation body protruding from a surface of the base, and at least one contact protruding from a surface of the heat dissipation body into contact with the inner circumferential wall of the PCB. Preferably, the through-hole in the substrate of the PCB is made up of a plurality of discrete passageways, and the heat dissipation column includes a plurality of contacts corresponding to the passageways, respectively.

The heat dissipation body of the heat dissipation column may be cylindrical. Each contact protrusion, on the other hand, may be hemispherical and extend into the through-hole of the substrate of the PCB by a predetermined amount. The inner circumferential wall of the PCB may have a curved portion that conforms to and contacts the hemispherical protrusion of the heat dissipation column. A desired spacing between the printed circuit board and the base can be maintained by appropriate sizing of the through-hole.

The base including the base heat dissipation column is preferably made of an aluminum alloy. The base also includes a plurality bosses by which the printed circuit board and the base are screwed together. At least one of the bosses is located close to a combo integrated circuit. The combo integrated circuit is mounted to the PCB such that the longitudinal central axis of the combo integrated circuit subtends an angle of 40°-50° with respect to the longitudinal central axis of the printed circuit board. Thus, heat will readily dissipate from the combo integrated circuit.

The printed circuit board may also have a ground strip which is to be coupled to a lower portion of the IC, and a conductive pad soldered to the ground strip. The inner circumferential wall of the substrate of the PCB is preferably copper plating that leaves the through-hole open and is connected to the conductive pad. The conductive pad is preferably also of copper.

According to another aspect of the present invention, there is provided a hard disk drive having a PCB to which an IC is mounted, and a base having a heat dissipation column, as described above, for transferring heat from the IC to the base. The head assembly and spindle motor assembly of the hard disk drive are assembled to the base. The PCB has a first major surface on which the IC is disposed and a second major surface. The base has an upper surface on which the head assembly and disk are disposed, and a lower surface that faces and is spaced from the second surface of the PCB. The heat dissipation column protrudes from the lower surface of the base into contact with the PCB.

BRIEF DESCRIPTION OF THE DRAWINGS

The above and/or other objects, aspects and advantages of the present invention will become apparent and more readily appreciated from the following detailed description, made in conjunction with the accompanying drawings of which.

DETAILED DESCRIPTION OF THE PREFERRED EMBODIMENTS

Figure 1:
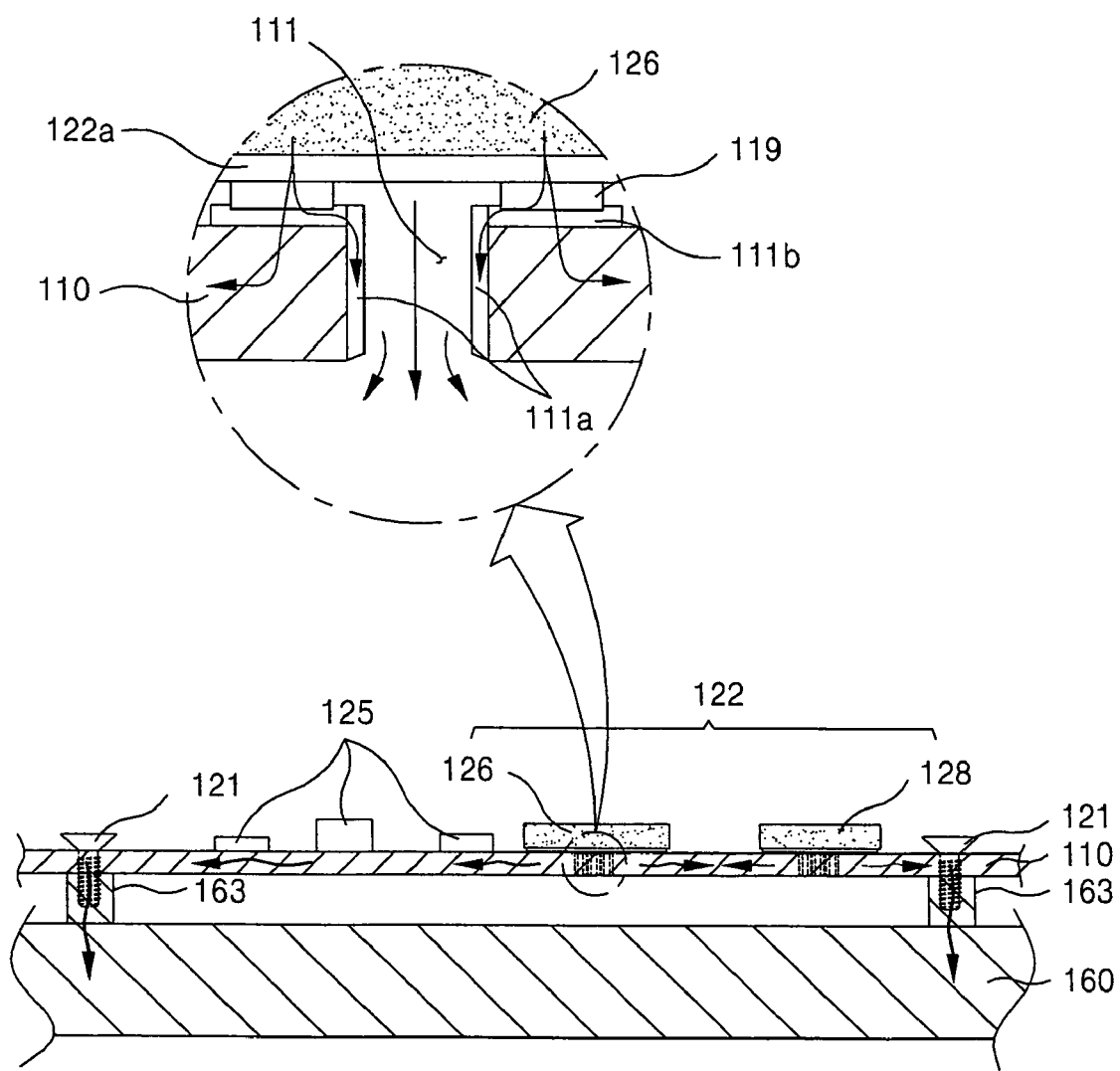
FIG. 1 is a cross sectional view of a base and a printed circuit board of a conventional hard disk drive, and includes an enlargement of a heat dissipating portion thereof.

The present invention will now be described in more detail with reference to FIGS. 2-5. Note, like reference numerals are used to designate like elements throughout the drawings.

Figure 2:
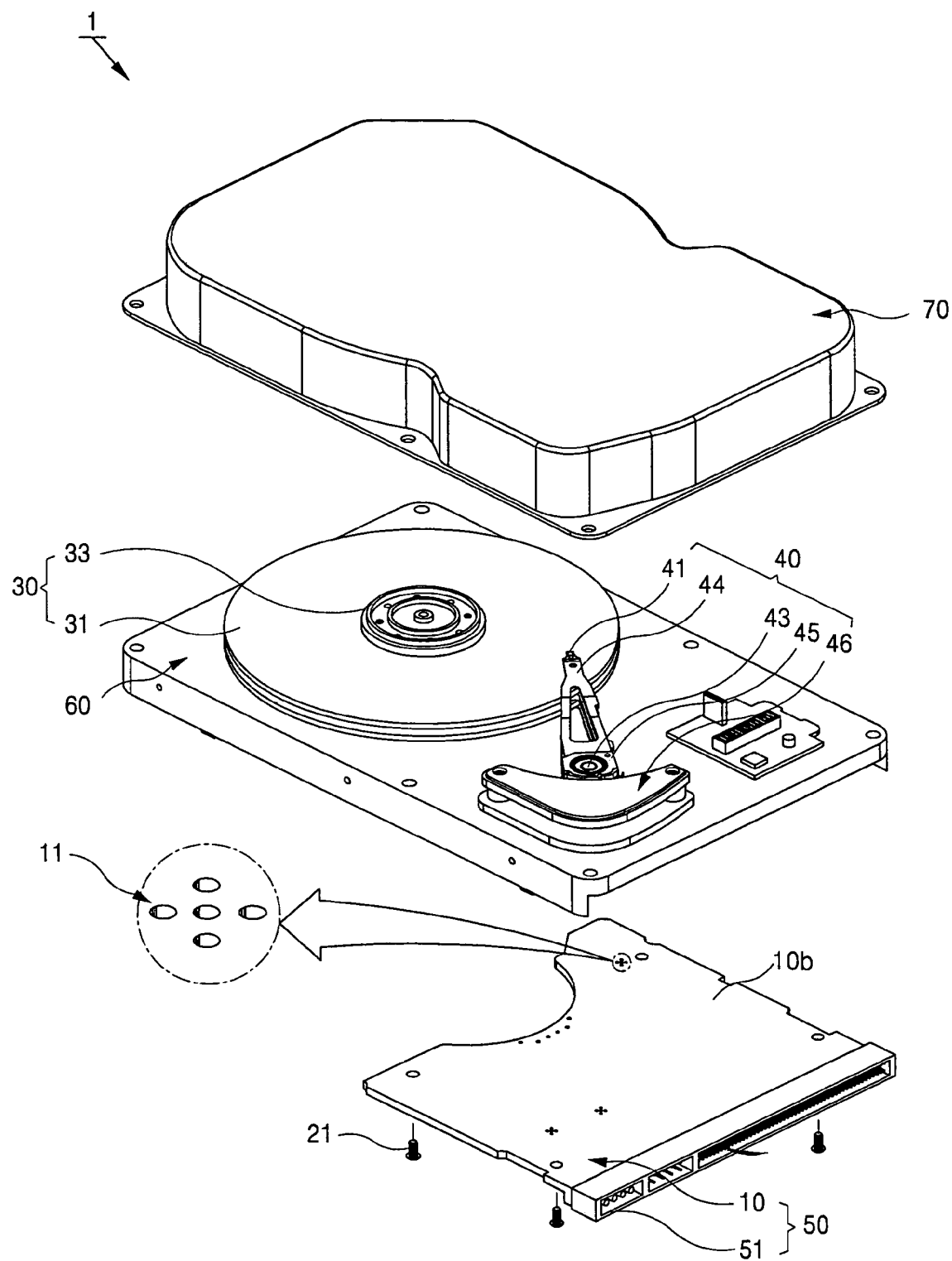
FIG. 2 is an exploded perspective view of a hard disk drive according to the present invention.
Figure 3:
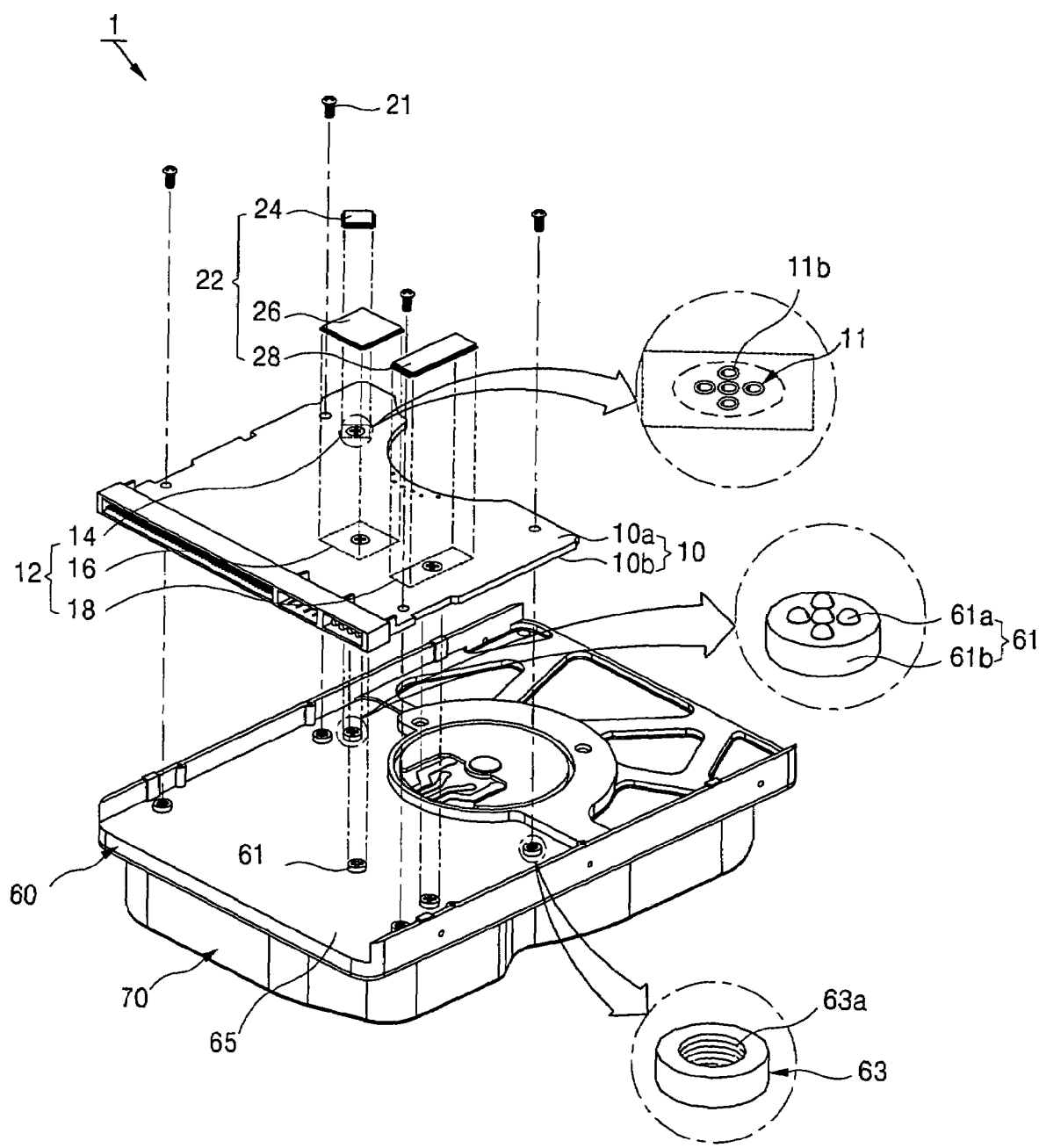
FIG. 3 is an exploded perspective view of the hard disk drive according to the present invention as viewed from the bottom thereof.
Figure 4:
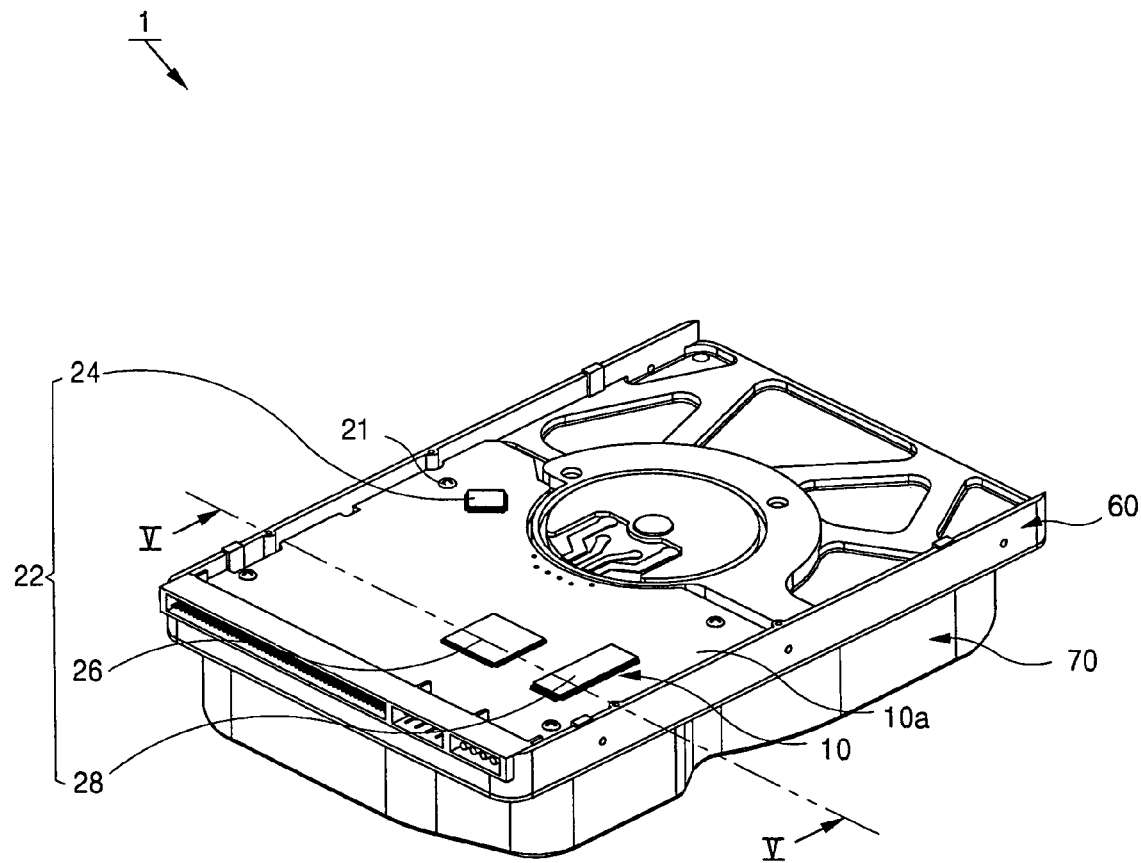
FIG. 4 is a perspective view of the hard disk drive in an assembled state.

Referring first to FIGS. 2 and 3, a hard disk drive (HDD) 1 according to the present invention includes a disk pack 30 having disks 31 for recording and storing data and various parts for supporting and rotating the disks 31, a head stack assembly (HSA) 40 to read the data from the disks 31, a printed circuit board assembly (PCBA) 50 having a printed circuit board (PCB) 10, integrated circuits (ICs) 22 mounted to the PCB 10, a base 60 having heat dissipation columns 61 that transfer heat generated by the integrated circuits (ICs) 22, and a cover 70 that covers the base 60.

The disk pack 30 also includes a spindle motor assembly having a hub that supports the disks 31, a spacer that separates the disks 31 from one another on the spindle motor hub, a clamping screw coupled to the spindle motor hub, and a clamp 33 that is threaded to the clamping screw to fix the disk 33 to the spindle motor hub and thereby clamp the disks 31 to the spindle motor hub. Also, a starter core (not shown) interacts with a magnet (not shown) installed on the spindle motor hub to generate an electromagnetic force that causes the spindle motor hub to rotate. Accordingly, the disk 31 rotates with the spindle motor hub.

The HSA 40 includes a head 41 to record data on a disk 31 or reproduce data from the disk 31, an actuator arm 44 supporting the head 41 above a disk 31 such that the head 41 can access the data on the disk 31, a support shaft 43 to which the actuator arm 44 is coupled, a shaft holder 45 that rotatably supports the support shaft 43 and the actuator arm 44 coupled thereto such that the actuator arm 44 can swing about the longitudinal axis of the shaft 43, and a voice coil motor (VCM) 46 for rotating the support shaft 43 within the shaft holder 45 to swing the actuator arm 44 about the longitudinal axis of the shaft 43. The voice coil motor (VCM) 46 extends from the pivot shaft holder 45 in a direction opposite to the actuator arm 44. The voice coil motor (VCM) 46 has a bobbin (not shown) extending from the actuator arm 44, a voice coil motor (VCM) coil wound around the bobbin, and magnets (not shown) between which the bobbin and hence, the voice coil motor (VCM) coil, are disposed. A force is applied to the bobbin when current flows through the VCM coil wound around the bobbin between the magnets. Thus, the bobbin pivots the actuator arm 44 on the pivot shaft holder 45. The current is controlled such that the head 41 supported at the end of the actuator arm 44 is moved across the disk 31 to search out tracks of the disk 31 and access information recorded on the tracks, for example. The information is converted to digital signals.

As shown best in FIG. 2, in addition to the PCB 10, the PCBA 50 includes a PCB connector 51 disposed at one side of the PCB 10. The HDD 1 transmits and receives signals through the PCB connector 51. The PCB 10 is coupled to the base 60 by screws 21. In addition, the substrate of the PCB 10 has a first surface 10a that defines IC mounting areas 12 on which the ICs 22 are disposed, respectively, a second surface 10b, and a respective through-hole 11 extending from each IC mounting area 12 of the first surface 10a to the second surface 10b. The ICs 22 are spaced from one another along the first surface 10a by intervals which take into account that the ICs 22 generate more heat than surrounding devices (not shown). As an example, the ICs 22 include a combo IC 24, an HDC 26, and a memory chip 28 mounted on respective IC mounting areas 14, 16, and 18 of the first surface 10a.

The HDC 26 is a semiconductor chip which controls the main functions of the HDD 1 and therefore, generates a relatively large amount of heat. Thus, the heat must be transferred efficiently from the HDC 26 to the outside the HDD 1. The combo IC 24 is mounted on the surface of the PCB 10 with the longitudinal central axis thereof inclined at an angle of about 45° with respect to the longitudinal central axis of the PCB 10. This allows the heat generated by the combo IC 24 to dissipate easily to the base 60 through the screw 21 closest to the combo IC 24. In some cases, though, the combo IC 10 can be mounted on the PCB 10 with its longitudinal central axis parallel to that of the PCB 10. The memory chip 28 may be a random access memory (RAM) or a read only memory (ROM) device. The amount of heat that needs to be transferred from the memory chip 28 is thus proportional to the storage capacity of the memory chip 28.

Figure 5:
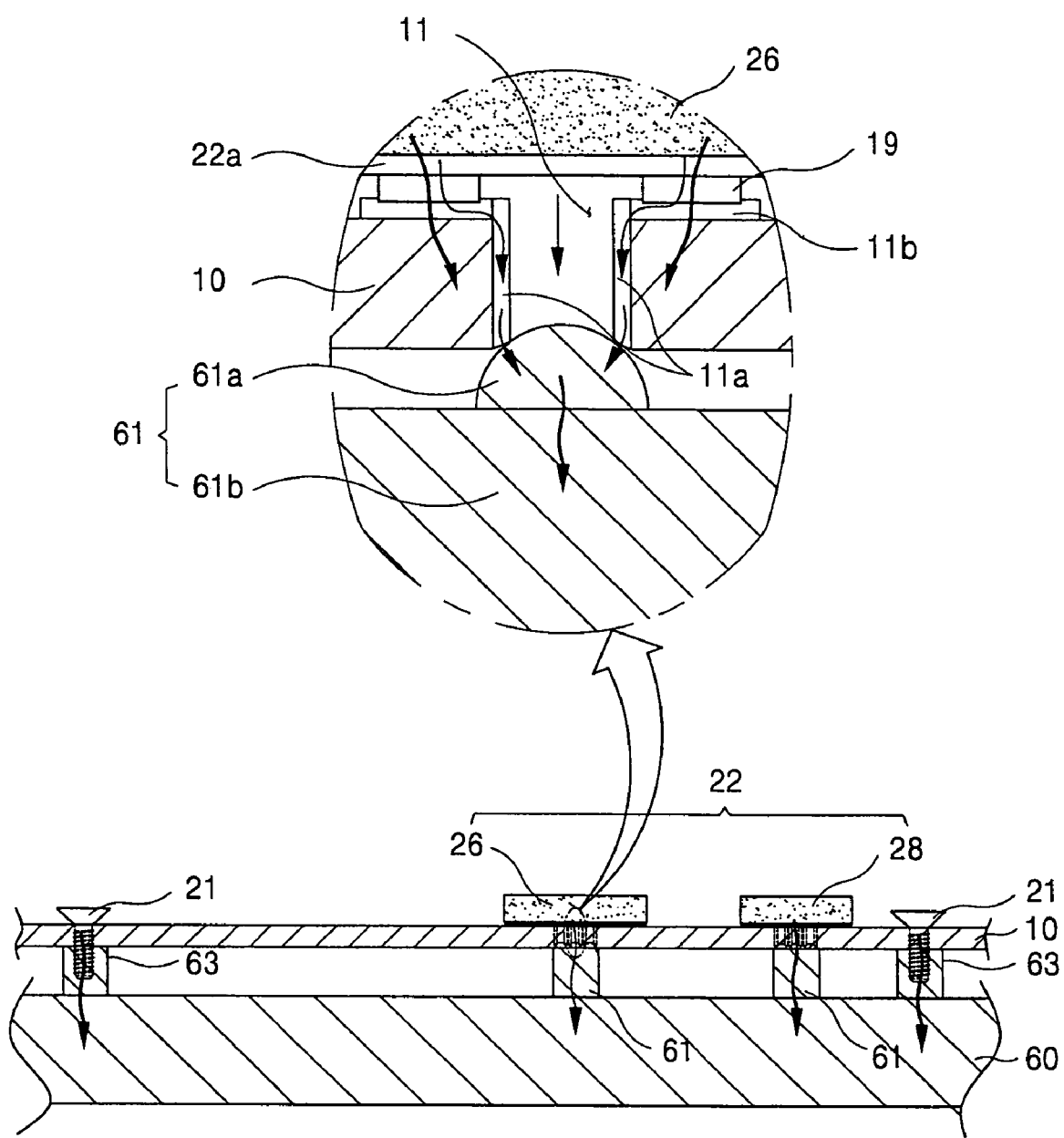
FIG. 5 is a cross sectional view of the hard disk drive according to the present invention, taken along line V-V of FIG. 4, and includes an enlargement of a heat dissipating portion of the hard disk drive.

In any case, as shown in FIG. 5, a ground strip 22a is coupled to the lower portion of each of the ICs 22. The ground strip 22a is formed of copper and is soldered to conductive pads 11b of the PCB 10. The PCB 10 is installed on the base 60 such that the second surface 10b of the PCB 10 faces a lower surface 65 of the base 60. As shown in FIGS. 3 and 5, each through-hole 11 is made up of a plurality of individual passageways open to a respective IC mounting area 12. Each base heat dissipation column 61 contacts an inner circumferential wall 11a that defines a through-hole 11 so as to facilitate the dissipation of heat from the IC 22, as will be described in more detail later on.

Referring again to FIGS. 2 through 5, the base 60 provides a basic frame to which the disk pack 30, the HSA 40, and the PCBA 50 are assembled. Most of the parts that are fixed to the base 60 are made of aluminum. The base 60 is generally die cast of an aluminum alloy so that its coefficient of thermal expansion is similar to those of most of the parts assembled to the base 60. Also, the stiffness of the aluminum alloy allows the base 60 to protect the parts mounted to it. Finally, aluminum has a relatively high thermal conductivity. Therefore, the base 60 can efficiently transfer heat from parts mounted to the base 60. Thus, heat generated by the ICs 22 is efficiently transferred to the base 60, i.e., the heat readily dissipates from the ICs 22.

As shown in FIGS. 3 and 5 in detail, the base 60 includes a plurality of bosses 63 each having an internal thread 63a. The bosses 63 protrude from the lower surface of the base 60 to support the PCB 10. The screws 21 extend through the PCB and are engaged with the threads 63a to fix the PCB 10 to the base 60. The bosses 63 facilitate the dissipation of heat because the bosses 63 are integral parts of the base 60 and hence, are formed with the of aluminum alloy having a high thermal conductivity. Thus, for example, the heat generated by the combo IC 24 is efficiently transferred to the base 60 through the boss 63 contacting the PCB 10 close to the combo IC 24.

Also, as mentioned above, the base 60 includes heat dissipation columns 61, i.e., the base heat dissipation columns 61 are integral parts of the base 60. Each base heat dissipation column 61 includes a heat dissipation body 61b protruding upward from the surface of the base 60 and a plurality of contact protrusions 61a protruding upward from the heat dissipation body 61b as spaced from each other. The heat dissipation body 61b is cylindrical and has the same size as the bosses 63. The heat dissipation body 61b thus presents a relatively large surface area to the outside air such that heat readily dissipates from the base heat dissipation column 61.

Also, in the present embodiment, the contact protrusions 61a are arranged in the form of a cross to correspond to the passageways 11b that constitute a through-hole 11 of the PCB 10. The protrusions 61a contact inner circumferential walls 11a of the PCB 10 that define the passageways of the through-hole 11. To this end, each of the contact protrusions 61a is hemispherical. The inner circumferential wall 11a may have a curved shape corresponding to the hemispherical shape of the contact protrusions 61a so that the inner circumferential wall 11a and the contact protrusions 61a contact each other over a greater area. In any case, heat generated by the IC 22 passes through the conductive pad 11b of the PCB 10, along the inner circumferential wall 11a and is transferred to the contact protrusions 61a. The heat transferred to the contact protrusions 61a is, in turn, transferred to the protruding heat dissipation body 61b.

The base heat dissipation columns 61 are easy to manufacture because they have relatively simple structures and are integral parts of the base 60. Furthermore, the base heat dissipation columns 61 are provided on the same lower surface of the base 60 as the bosses 63. Therefore, the base heat dissipation columns 61 do not affect the overall size of the HDD 1 nor do the base heat dissipation columns 61 require a re-design of other parts of the HDD 1.

Figure 6:
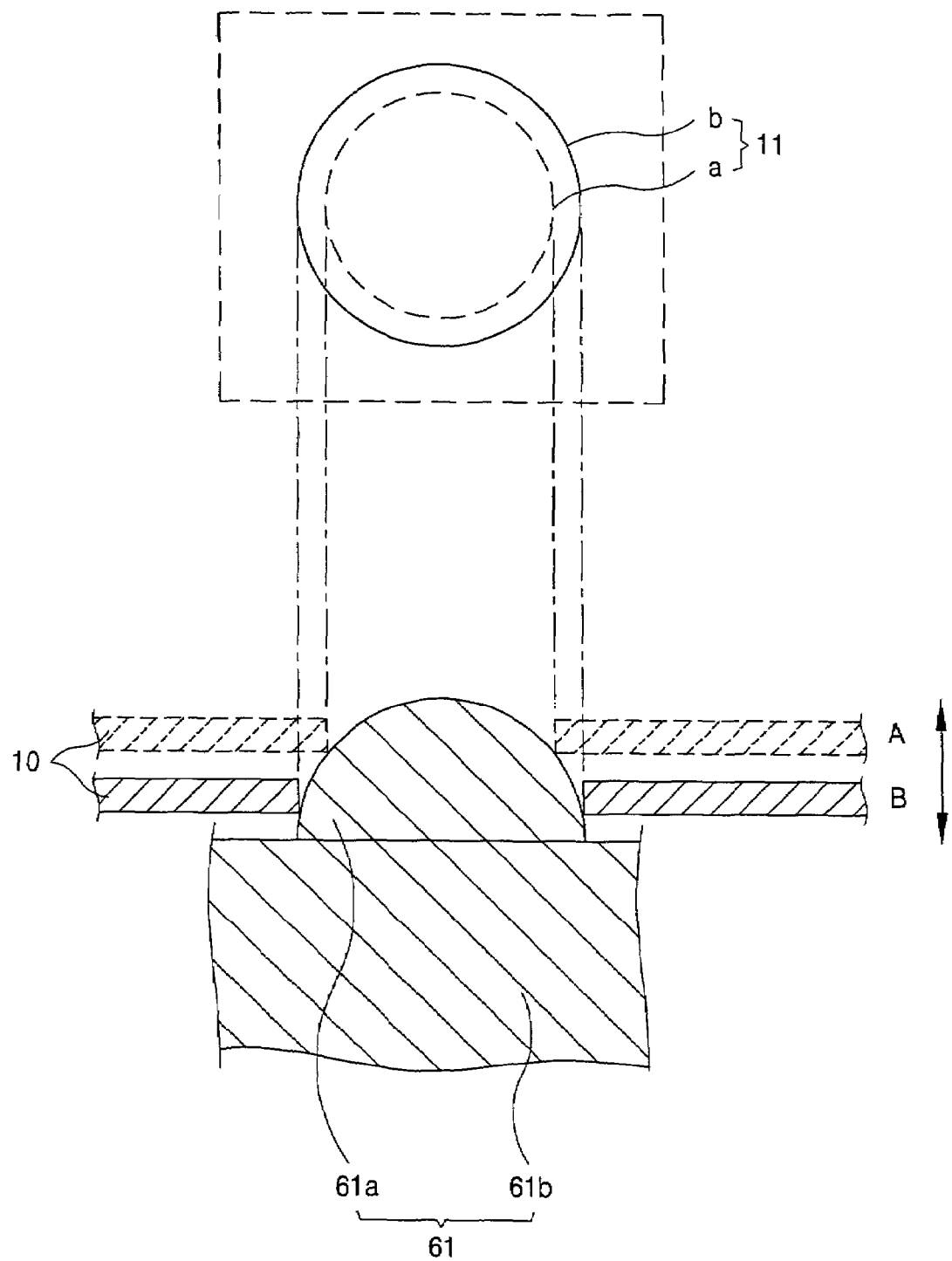
FIG. 6 is an explanatory diagram illustrating differences in the assembly height of a PCB on a heat dissipation column according to the size of a through-hole of the substrate of the PCB, in a hard disk drive according to the present invention.

Referring now to FIG. 6, the PCB 10 is located at position A when the passageways constituting the through-hole 11 each have a size (cross-sectional area) indicated by dotted line (a), and the PCB 10 is located at position when the passageways constituting the through-hole 11 each having a size indicated by solid line (b). That is, the spacing between the PCB 10 and the base 60 depends on the size of the passageways constituting the through-hole 11. Thus, a desired spacing between the PCB 10 and the base 60 can be provided by selecting an appropriate size of the passageways constituting the through-hole 11 of the PCB 10. Likewise, the amount of contact between the contact protrusions 61a and the inner circumferential wall 11a of the PCB 10, and hence, the rate of heat transfer, can be designed for. Thus, the HDD 1 can be appropriately designed without affecting the overall size of the HDD 1.

During the operation of the HDD 1, the ICs 22 mounted to the PCB 10 receive electric power and control the operation of the mechanical components of the HDD. Specifically, the ICs control the spindle motor to rotate the disk 31, and control the VCM 46 to pivot the actuator arm 44 and thereby move the head 41 over a recording surface of the disk 31. At this time, the ICs 22 such as the HDC 26 and the combo IC 24 generate a relatively large amount of heat. However, as shown in FIG. 5, the heat generated by an IC 22 is transferred through the ground strip 22a, the solder 19, the conductive pad 11b, and the inner circumferential wall 11a as indicated by the arrows in the enlarged portion of the figure. Then, the heat is transferred from the inner circumferential wall 11a to the heat dissipation body 61b and the base 60 via the contact protrusions 61a that contact the PCB 10 along the inner circumferential wall 11a. Also, some of the heat radiating from the IC 22 passes through the through-hole 11 and is absorbed by the protrusions 61a which close the through-hole 11. Furthermore, some of the heat generated by the IC 22 is transferred to the base 60 via the screws 21 and the bosses 63 by which the PCB 10 and base are coupled, as also indicated by arrows in the figure.

In the conventional HDD, most of the heat radiating from the ICs 22 is transferred to the screws 121 and the bosses 163 (refer back to FIG. 1). In this case, the heat passes under the other devices 125 mounted to the PCB and thus, adversely affects the surrounding devices. Also, the average temperature of the PCB 10 is raised significantly. On the other hand, in the present invention, most of the heat radiating from the ICs 22 is transferred to the base 60 by the heat dissipation columns 61 disposed directly across from the ICs (IC mounting areas) on the other side of the PCB. Thus, the devices mounted to the PCB adjacent the ICs are not as affected by the heat and the average temperature of the PCB 10 remains fairly low by comparison.

Finally, although the present invention has been shown and described above in connection with the preferred embodiments thereof, the present invention is not limited to these embodiments. For example, although the contact protrusions 61a of the base heat dissipation column 61 have been shown and described as being hemispherical, the contact protrusions 61a may instead be conical. Also, although the contact protrusions 61a of the base heat dissipation column 61 have been shown and described as being arranged in form of a cross on the heat dissipation body 61b, the contact protrusions 61a may be arranged instead in the form of a rectangle on the heat dissipation body 61b. Accordingly, changes may be made to the preferred embodiments without departing from the true spirit and scope of the invention which is defined by the appended claims.

What is claimed is:

1. A support structure of an electronic device, comprising:
an integrated circuit;

a printed circuit board (PCB) to which the integrated circuit is mounted, the PCB including a substrate having first and second opposite major surfaces, and a through-hole, the first surface having an integrated circuit (IC) mounting area having a shape conforming to that of the integrated circuit and occupied by the integrated circuit, and the through-hole open to the first surface within the IC mounting area; and a base supporting the printed circuit board, the base having a surface that faces and is spaced from the second surface of the PCB, and the base including a heat dissipation column protruding from said surface of the base into contact with an inner circumferential wall of the PCB that defines the through-hole of the substrate of the PCB such that the heat dissipation column contacts the PCB at a location directly opposite the IC mounting area, whereby the heat dissipation column will transfer heat generated by the integrated circuit to the base.

2. The support structure of claim 1, wherein the heat dissipation column includes a heat dissipation body protruding from said surface of the base, and at least one contact protrusion protruding from a surface of the heat dissipation body into contact with the inner circumferential wall of the PCB.

3. The support structure of claim 2, wherein the through-hole is constituted by discrete passageways each extending through the substrate of the PCB, and the at least one contact protrusion comprises a plurality of contact protrusions corresponding to the passageways, respectively, each of the contact protrusions protruding from the surface of the heat dissipation body into contact with a surface of the PCB that defines a respective one of the passageways.

4. The support structure of claim 2, wherein each said at least one contact protrusion is hemispherical.

5. The support structure of claim 4, wherein the inner circumferential wall has a curved portion whose shape is complimentary to that of the contact protrusion and is disposed in contact with the contact protrusion.

6. The support structure of claim 2, wherein the heat dissipation body is cylindrical.

7. The support structure of claim 3, wherein the contact protrusions are arrayed in the shape of a cross.

8. The support structure of claim 1, wherein the PCB comprises a ground coupled to a bottom surface of the integrated circuit, and a conductive pad soldered to the ground, and the inner circumferential wall comprises copper plating connected to the conductive pad.

9. The support structure of claim 8, wherein the conductive pad is of copper.

10. The support structure of claim 1, wherein the base including the base heat dissipation column is of an aluminum alloy.

11. The support structure of claim 1, wherein the integrated circuit is a hard disk controller (HDC).

12. The support structure of claim 1, wherein the integrated circuit is a combo integrated circuit (combo IC).

13. The support structure of claim 12, wherein the base comprises a plurality of bosses each having an internal thread, and screws extend through the PCB and into engagement with the internal threads of the bosses, respectively, to fix the base and the PCB together, at least one of the screws being disposed adjacent the combo integrated circuit.

14. The support structure of claim 13, wherein a longitudinal central axis of the combo integrated circuit subtends an angle of 40°-50° with respect to a longitudinal central axis of the PCB.

15. A hard disk drive comprising:

a disk and a spindle motor assembly to which the disk is mounted, the disk having a magnetic layer on a surface thereof;

a head assembly including a head that records data on the disk and/or reproduces data from the disk, an actuator arm supporting the head above the disk such that the head can access the disk, and a voice coil motor (VCM) operable to swing the actuator arm about an axis;

an integrated circuit;

a printed circuit board (PCB) to which the integrated circuit is mounted, the PCB including a substrate having first and second opposite major surfaces, and a through-hole, the first surface having an integrated circuit (IC) mounting area having a shape conforming to that of the integrated circuit and occupied by the integrated circuit, and the through-hole open to the first surface within the IC mounting area; and a base to which the printed circuit board, the head assembly, and the spindle motor assembly are assembled, the base having an upper surface on which the head assembly and disk are disposed, and a lower surface that faces and is spaced from the second surface of the PCB, and the base including a heat dissipation column protruding from the lower surface thereof into contact with an inner circumferential wall of the PCB that defines the through-hole of the substrate of the PCB such that the heat dissipation column contacts the PCB at a location directly opposite the IC mounting area, whereby the heat dissipation column will transfer heat generated by the integrated circuit to the base.

16. The hard disk drive of claim 15, wherein the heat dissipation column of the base includes a heat dissipation body protruding from said lower surface of the base, and at least one contact protrusion protruding from a surface of the heat dissipation body into contact with the inner circumferential wall of the PCB.

17. The hard disk drive of claim 16, wherein the through-hole of the substrate of the PCB is constituted by discrete passageways each extending through the substrate, and the at least one contact protrusion comprises a plurality of contact protrusions corresponding to the passageways, respectively, each of the contact protrusions protruding from the surface of the heat dissipation body into contact with a surface of the PCB that defines a respective one of the passageways.

18. The hard disk drive of claim 16, wherein each said at least one contact protrusion is hemispherical.

19. The hard disk drive of claim 15, wherein the base including the base heat dissipation column is of an aluminum alloy.

\* \* \* \* \*